United States Patent
Seefeldt et al.

(10) Patent No.: US 8,731,215 B2
(45) Date of Patent: May 20, 2014

(54) LOUDNESS MODIFICATION OF MULTICHANNEL AUDIO SIGNALS

(75) Inventors: Alan Jeffrey Seefeldt, San Francisco, CA (US); Michael John Smithers, Kareela (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 13/338,143

(22) Filed: Dec. 27, 2011

(65) Prior Publication Data
US 2012/0106743 A1 May 3, 2012

Related U.S. Application Data (63) Continuation of application No. 13/215,058, filed on Aug. 22, 2011, which is a continuation of application No. 12/225,988, filed as application No. PCT/US2007/006444 on Mar. 14, 2007, now Pat. No. 8,019,095.

(60) Provisional application No. 60/789,523, filed on Apr. 4, 2006, provisional application No. 60/857,617, filed on Nov. 7, 2006.

(51) Int. Cl.
  *H03G 5/00* (2006.01)
  *H03G 9/00* (2006.01)

(52) U.S. Cl.
  USPC ............................................. 381/98; 381/102

(58) Field of Classification Search
  USPC .......................................... 381/98, 101, 102
  See application file for complete search history.

(56) References Cited

U.S. PATENT DOCUMENTS

| | | | |
|---|---|---|---|
| 2,808,475 A | 10/1957 | Stryker | |
| 4,281,218 A | 7/1981 | Chuang et al. | |
| 4,543,537 A | 9/1985 | Kuhn et al. | |
| 4,739,514 A | 4/1988 | Short et al. | |
| 4,887,299 A | 12/1989 | Cummins et al. | |
| 5,027,410 A | 6/1991 | Williamson et al. | |
| 5,043,970 A * | 8/1991 | Holman | 369/89 |
| 5,097,510 A | 3/1992 | Graupe | |
| 5,172,358 A | 12/1992 | Kimura | |
| 5,278,912 A | 1/1994 | Waldhauer | |
| 5,363,147 A | 11/1994 | Joseph et al. | |
| 5,369,711 A | 11/1994 | Williamson, III | |
| 5,377,277 A | 12/1994 | Bisping | |

(Continued)

FOREIGN PATENT DOCUMENTS

| | | |
|---|---|---|
| TW | 381403 | 2/2000 |
| TW | 391148 | 5/2000 |
| WO | 95/34964 | 12/1995 |

*Primary Examiner* — Duc Nguyen
*Assistant Examiner* — Kile Blair (57) ABSTRACT

Scaling, by a desired amount $s_m$, the overall perceived loudness $L_m$ of a multichannel audio signal, wherein perceived loudness is a nonlinear function of signal power P, by scaling the perceived loudness of each individual channel $L_c$ by an amount substantially equal to the desired amount of scaling of the overall perceived loudness of all channels $s_m$ subject to accuracy in calculations and the desired accuracy of the overall perceived loudness scaling $s_m$. The perceived loudness of each individual channel may be scaled by changing the gain of each individual channel, wherein gain is a scaling of a channel's power. Optionally, in addition, the loudness scaling applied to each channel may be modified so as to reduce the difference between the actual overall loudness scaling and the desired amount of overall loudness scaling.

15 Claims, 5 Drawing Sheets

(Channel 1: Left)

(56) References Cited

U.S. PATENT DOCUMENTS

| | | | |
|---|---|---|---|
| RE34,961 E | 6/1995 | Widin et al. |
| 5,457,769 A | 10/1995 | Valley |
| 5,500,902 A | 3/1996 | Stockham, Jr. et al. |
| 5,530,760 A | 6/1996 | Paisley |
| 5,548,638 A | 8/1996 | Yamaguchi et al. |
| 5,583,962 A | 12/1996 | Davis et al. |
| 5,615,270 A | 3/1997 | Miller et al. |
| 5,632,005 A | 5/1997 | Davis |
| 5,633,981 A | 5/1997 | Davis |
| 5,649,060 A | 7/1997 | Ellozy et al. |
| 5,663,727 A | 9/1997 | Vokac |
| 5,682,463 A | 10/1997 | Allen et al. |
| 5,712,954 A | 1/1998 | Dezonno |
| 5,724,433 A | 3/1998 | Engebretson et al. |
| 5,727,119 A | 3/1998 | Davidson |
| 5,819,247 A | 10/1998 | Freund et al. |
| 5,848,171 A | 12/1998 | Stockham, Jr. et al. |
| 5,862,228 A | 1/1999 | Davis |
| 5,878,391 A | 3/1999 | Aarts |
| 5,907,622 A | 5/1999 | Dougherty |
| 5,909,664 A | 6/1999 | Davis |
| 6,002,776 A | 12/1999 | Bhadkamkar et al. |
| 6,002,966 A | 12/1999 | Loeb et al. |
| 6,021,386 A | 2/2000 | Davis |
| 6,041,295 A | 3/2000 | Hinderks |
| 6,055,502 A * | 4/2000 | Kitamura ..................... 704/500 |
| 6,061,647 A | 5/2000 | Barrett |
| 6,088,461 A | 7/2000 | Lin et al. |
| 6,094,489 A | 7/2000 | Ishige et al. |
| 6,108,431 A | 8/2000 | Bachler |
| 6,125,343 A | 9/2000 | Schuster |
| 6,148,085 A | 11/2000 | Jung |
| 6,182,033 B1 | 1/2001 | Accardi et al. |
| 6,185,309 B1 | 2/2001 | Attias |
| 6,201,875 B1 | 3/2001 | Davis |
| 6,233,554 B1 | 5/2001 | Heimbigner et al. |
| 6,240,388 B1 | 5/2001 | Fukuchi |
| 6,263,371 B1 | 7/2001 | Geagan, III et al. |
| 6,272,360 B1 | 8/2001 | Yamaguchi et al. |
| 6,275,795 B1 | 8/2001 | Tzirkel-Hancock |
| 6,298,139 B1 | 10/2001 | Poulsen et al. |
| 6,301,555 B2 | 10/2001 | Hinderks |
| 6,311,155 B1 | 10/2001 | Vaudrey et al. |
| 6,314,396 B1 | 11/2001 | Monkowski |
| 6,327,366 B1 | 12/2001 | Uvacek |
| 6,332,119 B1 | 12/2001 | Hinderks |
| 6,351,731 B1 | 2/2002 | Anderson |
| 6,351,733 B1 | 2/2002 | Saunders |
| 6,353,671 B1 | 3/2002 | Kandel |
| 6,370,255 B1 | 4/2002 | Schaub |
| 6,411,927 B1 | 6/2002 | Morin |
| 6,430,533 B1 | 8/2002 | Kolluru |
| 6,442,278 B1 | 8/2002 | Vaudrey |
| 6,442,281 B2 | 8/2002 | Sato |
| 6,473,731 B2 | 10/2002 | Hinderks |
| 6,498,855 B1 | 12/2002 | Kokkosoulis |
| 6,529,605 B1 | 3/2003 | Christoph |
| 6,570,991 B1 | 5/2003 | Scheirer |
| 6,625,433 B1 | 9/2003 | Poirier |
| 6,639,989 B1 | 10/2003 | Zacharov |
| 6,650,755 B2 | 11/2003 | Vaudrey |
| 6,651,041 B1 | 11/2003 | Juric |
| 6,700,982 B1 | 3/2004 | Geurts |
| 6,807,525 B1 | 10/2004 | Li |
| 6,823,303 B1 | 11/2004 | Su |
| 6,889,186 B1 | 5/2005 | Michaelis |
| 6,985,594 B1 | 1/2006 | Vaudrey |
| 7,065,498 B1 | 6/2006 | Thomas |
| 7,068,723 B2 | 6/2006 | Foote |
| 7,155,385 B2 | 12/2006 | Berestesky |
| 7,171,272 B2 | 1/2007 | Blamev |
| 7,212,640 B2 | 5/2007 | Bizjak |
| 7,283,954 B2 | 10/2007 | Crockett |
| 7,454,331 B2 | 11/2008 | Vinton |
| 7,461,002 B2 | 12/2008 | Crockett |
| 7,551,745 B2 | 6/2009 | Gundry |
| 7,610,205 B2 | 10/2009 | Crockett |
| 7,617,109 B2 | 11/2009 | Smithers |
| 7,711,123 B2 | 5/2010 | Crockett |
| 2001/0027393 A1 | 10/2001 | Touimi |
| 2001/0038643 A1 | 11/2001 | McParland |
| 2002/0013698 A1 | 1/2002 | Vaudrey |
| 2002/0040295 A1 | 4/2002 | Saunders |
| 2002/0076072 A1 | 6/2002 | Cornelisse |
| 2002/0097882 A1 | 7/2002 | Greenberg |
| 2002/0146137 A1 | 10/2002 | Kuhnel |
| 2002/0147595 A1 | 10/2002 | Baumgarte |
| 2003/0002683 A1 | 1/2003 | Vaudrey |
| 2003/0035549 A1 | 2/2003 | Bizjak |
| 2004/0024591 A1 | 2/2004 | Boillot |
| 2004/0037421 A1 | 2/2004 | Truman |
| 2004/0042617 A1 | 3/2004 | Beerends |
| 2004/0076302 A1 | 4/2004 | Christoph |
| 2004/0146167 A1 | 7/2004 | Bennett |
| 2004/0184537 A1 | 9/2004 | Geiger |
| 2004/0190740 A1 | 9/2004 | Chalupper |
| 2006/0215852 A1 | 9/2006 | Troxel |
| 2007/0291959 A1 | 12/2007 | Seefeldt |

* cited by examiner

FIG. 4a *(Channel 1: Left)*

FIG. 4b (Channel 2: Center)

FIG. 4c (Channel 3: Right)

FIG. 4d (Channel 4: Left Surround)

FIG. 4e (Channel 5: Right Surround)

FIG. 4f
(Combined Channels)

LOUDNESS MODIFICATION OF MULTICHANNEL AUDIO SIGNALS

CROSS-REFERENCE TO RELATED APPLICATIONS; BENEFIT CLAIM

This application claims the benefit as a Continuation of Non-Provisional application Ser. No. 13/215,058 filed on Aug. 22, 2011, which is a Continuation of application Ser. No. 12/225,988 filed on Mar. 26, 2009 (now U.S. Pat. No. 8,019,095 issued Sep. 13, 2011), which is a National Stage Application under 35 U.S.C. §371 of International Application No. PCT/US2007/006444, with a filing date of Mar. 14, 2007, which claims the benefit of U.S. Provisional Patent Application Ser. No. 60/857,617 filed on Nov. 7, 2006, the entire contents of all of which are hereby incorporated by reference as if fully set forth herein, under 35 U.S.C. §120. The applicant(s) hereby rescind any disclaimer of claim scope in the parent application(s) or the prosecution history thereof and advise the USPTO that the claims in this application may be broader than any claim in the parent application(s).

TECHNICAL FIELD

The invention relates to audio signal processing. In particular, the invention relates to adjusting the overall perceived loudness of a multichannel audio signal while retaining approximately the relative perceived loudness between all the channels in order to preserve the perceived spatial balance. The invention includes not only methods but also corresponding computer programs and apparatus.

REFERENCES AND INCORPORATION BY REFERENCE

Certain techniques for measuring and adjusting perceived (psychoacoustic loudness) useful in better understanding aspects the present invention are described in published International patent application WO 2004/111994 A2, of Alan Jeffrey Seefeldt et al, published Dec. 23, 2004, entitled "Method, Apparatus and Computer Program for Calculating and Adjusting the Perceived Loudness of an Audio Signal" and in "A New Objective Measure of Perceived Loudness" by Alan Seefeldt et al, Audio Engineering Society Convention Paper 6236, San Francisco, Oct. 28, 2004. Said WO 2004/111994 A2 application and said paper are hereby incorporated by reference in their entirety.

Certain other techniques for measuring and adjusting perceived (psychoacoustic loudness) useful in better understanding aspects the present invention are described in published International patent application WO 2006/047600 A1 of Alan Jeffrey Seefeldt, published May 4, 2006, entitled "Calculating and Adjusting the Perceived Loudness and/or the Perceived Spectral Balance of an Audio Signal." Said WO 2006/047600 A1 application is hereby incorporated by reference in its entirety.

BACKGROUND ART

Many methods exist for objectively measuring the perceived loudness of audio signals. Examples of methods include A, B and C weighted power measures as well as psychoacoustic models of loudness such as "Acoustics— Method for calculating loudness level," ISO 532 (1975) and said PCT/US2005/038579 application. Weighted power measures operate by taking the input audio signal, applying a known filter that emphasizes more perceptibly sensitive frequencies while deemphasizing less perceptibly sensitive frequencies, and then averaging the power of the filtered signal over a predetermined length of time. Psychoacoustic methods are typically more complex and aim to better model the workings of the human ear. They divide the signal into frequency bands that mimic the frequency response and sensitivity of the ear, and then manipulate and integrate these bands while taking into account psychoacoustic phenomenon such as frequency and temporal masking, as well as the non-linear perception of loudness with varying signal intensity. The aim of all methods is to derive a numerical measurement that closely matches the subjective impression of the audio signal.

Figure 1:
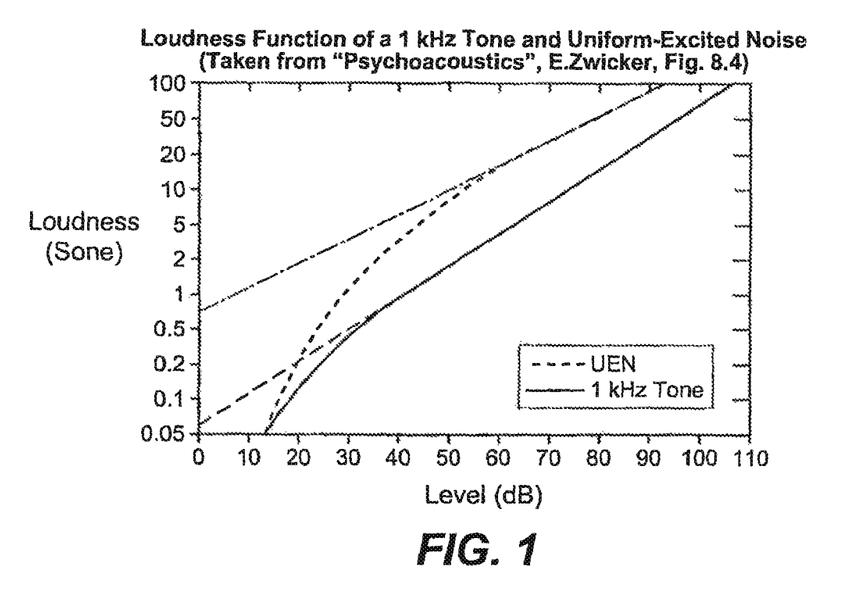
FIG. 1 shows the non-linear growth of loudness for both a 1 kHz tone and uniform exciting noise (UEN).
Figure 2:
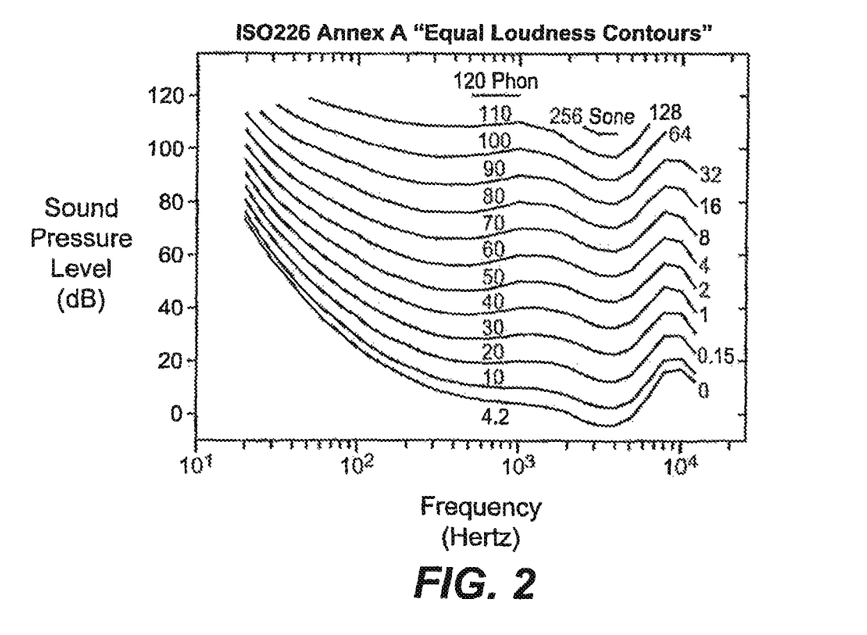
FIG. 2 shows the equal loudness contours of ISO 226. The horizontal scale is frequency in Hertz (logarithmic base 10 scale) and the vertical scale is sound pressure level in decibels.

Accurate modeling of the non-linearity of the human auditory system forms the basis of perceptual models of loudness. In the 1930's, Fletcher and Munson found that the relative change in sensitivity decreased as the level of sound increased. In the 1950's, Zwicker and Stevens built on the work of Fletcher and Munson and developed more accurate and realistic models. FIG. 1, published by Zwicker, shows the growth of loudness of both a 1 kHz tone and uniform exciting noise (UEN, noise with equal power in all critical bands). For a signal level below what is often termed the "hearing threshold," no loudness is perceived. Above this threshold, there is a quick rise in perceived loudness up to an asymptote where loudness grows linearly with signal level. Where FIG. 1 shows the non-linear behavior for a 1 kHz tone, the equal loudness contours of ISO 226 in FIG. 2 show the same behavior but as a function of frequency for sinusoidal tones. The contour lines, at increments of 10 phon, show the sound pressure levels across frequency that the human ear perceives as equally loud. The lowest line represents the "hearing threshold" as a function of frequency. At lower levels the lines of equal loudness compress closer together such that relatively smaller changes in sound pressure level cause more significant changes in perceived loudness than at higher levels.

The non-linear and frequency varying behavior of the human auditory system has a direct impact on the perceived timbre and imaging of audio signals. A complex, wideband audio signal, for example music, presented at a particular sound pressure level is perceived as having a particular spectral balance or timbre. If the same audio signal is presented at a different sound pressure level and, as shown in FIG. 2, the growth of perceived loudness is different for different frequencies, the perceived spectral balance or timbre of the audio signal will be different. A complex, wideband multichannel audio signal, presented over multiple loudspeakers, is also perceived as having a particular spatial balance. Spatial balance refers to the impression of the location of sound elements in the mix as well as the overall diffuseness of the mix due to the relative level of audio signals between two or more loudspeakers. If the same multichannel audio signal is presented at a different overall sound pressure level, the non-linear growth in perceived loudness and differing growth of loudness across frequency leads to a change in the perceived spatial balance of the multichannel audio signal. This is especially apparent when there is a significant difference in level between channels. Quieter channels will be affected differently to louder channels which, for example, can lead to quiet channels dropping below the hearing threshold and audibly disappearing when the overall level is reduced.

In many situations there is a desire to adjust or scale the perceived loudness of an audio signal. The most obvious examples are the traditional volume or level controls that appear on many devices including consumer music players, home theater receiver/amplifiers and professional mixing consoles. This simple volume or level control gain adjusts the audio signal without any consideration of the human auditory system and resulting change in perceived timbre and spatial balance.

More recently Seefeldt et. al (said WO 2004/111994 A2 application) and Seefeldt (said PCT/US2005/038579 application) have disclosed inventions, aspects of which enable accurate scaling of the perceived loudness of a monophonic audio signal and, depending on whether implementations thereof are wideband or multiband, maintain the perceived timbre. According to aspects of such inventions, a desired loudness scaling or target loudness may be achieved by, in essence, inverting the loudness measurement model and calculating either a wideband gain or multiband gains that can be applied to the audio signal.

While such approaches solve the problem of adjusting the loudness of a monophonic audio signal, the question still remains of how to adjust the loudness of a multichannel audio signal.

Multichannel loudness is typically calculated as a function of the sum of the power in each channel. For weighted power methods such as the A, B and C weighted measures mentioned above, the multichannel loudness is a simple sum of the weighted power in each channel. Commonly for psychoacoustic models of loudness, a critical band power spectrum or excitation spectrum is first calculated for each channel and the excitation spectrums are then summed across all the channels to create a single excitation spectrum. Each excitation band is passed through a non-linearity, such as FIG. 1, to create a measure of loudness per band, known as specific loudness, and the specific loudness is summed across frequency to calculate a single, wideband loudness value. For both weighted power and psychoacoustics methods, the function of the sum of the power in each channel may include additional per channel weightings to take into account head related transfer function (HRTF) effects.

Because the loudness of a multichannel signal can be calculated relatively simply, it is possible to calculate a single gain that, when applied to all channels, causes an overall desired change in loudness. However, this single gain may have undesirable effects on other attributes of the multichannel presentation. If differences exist in the relative signal levels between channels in the multichannel presentation and if all channels are scaled by the same gain, quieter channels will have a larger perceived change in their loudness than louder channels. This may cause a change in the perceived spatial balance that is worst when some channels fall below the threshold of hearing. For example, in many 5.1 audio mixes for film, the front channels contain signals of a significantly higher level than the surround channels. The center channel in particular is generally used to reproduce dialogue. The lower level surround channels, however, may contain signals that create a sense of diffuseness in the mix. For example, they may contain the reverberant portion of the dialogue in order to simulate the effect of someone speaking in a large room. As the loudness of such a signal is decreased by applying the same gain to all channels, the surround channels decrease in loudness more rapidly than the front channels, eventually falling below the threshold of hearing. The result is a significant collapse in the intended diffuse spatial balance.

According to aspects of the present invention, a desired scaling in the overall perceived loudness of a multichannel presentation may be achieved to a desired accuracy, while retaining, to a desired accuracy, the relative perceived loudness among channels in order to preserve a perceived spatial balance or timbre.

DISCLOSURE OF THE INVENTION

The invention is directed to a method for scaling, by a desired amount $s_m$, the overall perceived loudness $L_m$ of a multichannel audio signal, wherein perceived loudness is a nonlinear function of signal power P, by scaling the perceived loudness of each individual channel $L_c$ by an amount substantially equal to the desired amount of scaling of the overall perceived loudness of all channels $s_m$, subject to accuracy in calculations and the desired accuracy of the overall perceived loudness scaling $s_m$. The perceived loudness of each individual channel may be scaled by changing the gain of each individual channel, wherein gain is a scaling of a channel's power.

Optionally, in addition, the loudness scaling applied to each channel is modified so as to reduce the difference between the actual overall loudness scaling and the desired amount of overall loudness scaling.

The loudness scaling applied to each channel may be modified by applying a common multiplier to the gain of each channel or by adding a common scaling offset to the scaling of each channel.

The perceived loudness of each channel and the overall perceived loudness may both be measured in each of a plurality of frequency bands and the amplitude of each channel adjusted in such frequency bands. The frequency bands may be critical bands. Alternatively, the perceived loudness of each channel and the overall perceived loudness may both be measured in a single wideband frequency band.

In another aspect, the invention may be practiced by apparatus adapted to perform any of the above-mentioned methods.

In yet another aspect, the invention may be practiced by a computer program, stored on a computer-readable medium for causing a computer to perform any of the above-mentioned methods.

General Description of Invention

In general terms, the measure of loudness L may be described as a function F of signal power P. Signal power P is a power measure of the audio signal. This could be the A, B or C weighted power or a multiband excitation spectrum. See, for example, ANSI S1.42-2001 (R2006), American National Standard Design Response of Weighting Networks for Acoustical Measurements. The function F is a non-linearity designed to approximate variations in the growth of loudness. This function could be as simple as the single UEN function of FIG. 1 applied to a single, wideband power measure or as complex as a psychoacoustic model of loudness where the excitation spectrum is converted, through different per-band nonlinearities, to a specific loudness spectrum and then to a single loudness value (as in said PCT/US2005/038579 application, for example). It should be noted that while traditional weighted power loudness measures such as A weighted power attempt to take into account the frequency varying sensitivity of the human auditory system, they do not take into account the variation in level sensitivity. It may therefore be useful to pass a traditional weighted power measure through a non-linearity such as the one described above.

$$L = F\{P\} \tag{1}$$

Assuming that the loudness function is invertible, a gain scaling g of the signal power P may be calculated such that the gain change results in a particular, desired scaling s of the perceived loudness.

$$s \cdot L = F\{g \cdot P\} \tag{2a}$$

$$g = \frac{F^{-1}\{s \cdot L\}}{P} \tag{2b}$$

Thus, gain g is a scaling of the power P, whereas s is a scaling of the loudness L.

If the function F were linear, then Eqn. 2a would simplify to $sL = g F\{P\} = gL$ that yields the trivial solution $g = s$, independent of the signal power P. However, with a nonlinear function F, the gain g is, in general, a function of the signal power P as shown in Eqn. 2b. In other words, different signal powers P require different gains g for the same loudness scaling s.

The overall (all channel) measure of loudness $L_m$ of a multichannel audio signal may, in practice, be approximated as a function of the sum of the per channel power $P_c$ of each of the channels in the multichannel audio signal. The total number of channels is C.

$$L_m = F\left\{\sum_{c=1}^{C} P_c\right\} \tag{3}$$

Note that the sum of the per-channel power may be weighted to take into account head related transfer function (HRTF) effects. That is, signals from different spatial directions may have slightly different, relative perceived loudness. If one knows or assumes where the listener is in relation to the loudspeakers reproducing the multiple channels, then one may build a model of the signals arriving at a listener's ears as a function of the individual channel signals (generally, filtered and summed versions of the channel signals). The loudness may then be computed from such ear signals. In practice, however, performing a power sum of the channel signals works well for most listening environments.

Now again assuming that the loudness function is invertible, a single gain $g_m$ applied to all channels may be calculated such that the result is a desired scaling $s_m$ of the overall perceived loudness.

$$s_m \cdot L_m = F\left\{g_m \sum_{c=1}^{C} P_c\right\} \tag{4a}$$

$$g_m = \frac{F^{-1}\{s_m \cdot L_m\}}{\sum_{c=1}^{C} P_c} \tag{4b}$$

However, applying the same gain scaling $g_m$ to all the channels may undesirably affect the spatial balance of the modified audio. In particular, the computation of the gain $g_m$ will be most influenced by the channels with the greatest amount of power. If other channels have significantly less power, then the gain $g_m$ may cause a significantly different perceived change in these lower level channels in comparison to the higher level channels due to the non-linearity of human loudness perception. If the scaling $s_m$ corresponds to an attenuation in loudness, too much attenuation may be applied to these lower level channels. As a result, the relative contribution of such low level channels to the spatial balance of the mix will be diminished, and at worst, the channels will become completely inaudible.

The present invention addresses the problem of maintaining the spatial balance of a multichannel audio signal while imparting a desired change to its overall loudness. Accurately measuring and characterizing the spatial balance of a multichannel audio signal is highly complex. Portions of the spectra of the various channels may fuse perceptually into virtual sources located between the speakers through which the channels are played, while other portions of the channels may combine to form the perception of a diffuse sound field surrounding the listener. Measuring the perceived loudness of these various components in relation to each other is not a well understood problem as it involves the complex phenomenon of certain audio signal components partially masking other components. The degree of masking is a function of the level of each source as well as the spatial location and diffuseness of each source. Even if one were able to accurately measure all these aspects of the spatial balance, attempting to preserve their relative measures as the overall loudness is scaled would likely involve a complex non-linear optimization process.

Consider, however, a simple example of a two-channel signal in which each channel contains a signal that does not overlap spectrally with the signal in the other channel. Each channel will then be perceived as a distinct source with neither source masking the other. In this simple case, it becomes clear that maintaining the relative loudness of the two components may be achieved by scaling the loudness of each individual channel (rather than the gain of each channel) by the same amount. The inventors have found that applying this solution generally to a multichannel signal helps preserve the spatial balance without the introduction of any objectionable side-effects.

In a basic implementation of aspects of the invention, the perceived loudness of each individual channel $L_c$ (taken in isolation) may be scaled by an amount of scaling $s_c$ substantially equal to a desired amount of scaling, $s_m$, of the overall perceived loudness of all channels, subject to accuracy in calculations and the desired accuracy of the overall perceived loudness scaling This solution mitigates the problem, mentioned above, of low level channels falling below the threshold of hearing due to the influence of higher level channels. Such a scaling in the perceived loudness of each individual channel $L_c$ may be accomplished by controlling the individual gain $g_c$ of each channel (where such gain $g_c$ is a scaling of the channel's power $P_c$). Note, as discussed further below, that such individual channel gains $g_c$ generally are not the same as the gain $g_m$ mentioned above in connection Eqns. 4a and 4b. This may be may be better understood, for example, by reference to Eqns. 5a and 5b:

$$s_m \cdot L_c = F\{g_c \cdot P_c\} \text{ for each of } C \text{ channels} \tag{5a}$$

or $$g_c = \frac{F^{-1}\{s_m \cdot L_c\}}{P_c} \text{ for each of } C \text{ channels} \tag{5b}$$

where $s_c = s_m$.

Although such a basic implementation of the invention substantially maintains the spatial balance and is usable in many applications, such implementations may not assure that the desired overall scaling $s_m$ of the multichannel perceived loudness $L_m$ is achieved due to the non-linearity of the function F. Because F is non-linear, the gain $g_m$ given by Eqn. 4b is, in general, not equal to the gains $g_c$ given by Eqn. 5b. Therefore, the loudness of all channels after the application of $g_m$ to all channels is not equal, in general, to the loudness of all channels after applying the gains $g_c$ to each respective channel:

$$F\left\{\sum_{c=1}^{C} g_m P_c\right\} \ne F\left\{\sum_{c=1}^{C} g_c P_c\right\} \tag{6a}$$

Substituting the left hand side of Eqn. 6a with Eqn. 4a and $g_c$ with Eqn. 5b yields the equivalent expression:

$$s_m \cdot L_m \ne F\left\{\sum_{c=1}^{C} F^{-1}\{s_m \cdot L_c\}\right\} \tag{6b}$$

Thus, there may be a difference or error between (1) the perceived loudness of all channels resulting from scaling the perceived loudness of each of the individual channels $L_c$ by the desired overall perceived loudness scaling factor $s_m$ (expressed, for example, by the right hand portion of Eqn. 6b) and (2) the perceived loudness of all channels resulting from scaling directly by the overall loudness scaling factor $s_m$ (expressed, for example, by the left hand portion of Eqn. 6b). One may express this error as a scaling delta $\Delta s_m$ which when summed with the desired overall loudness scaling $s_m$ turns Eqn. 6b into an equality:

$$(s_m + \Delta s_m)L_m = F\left\{\sum_{c=1}^{C} F^{-1}\{s_m L_c\}\right\} \tag{6c}$$

or, rearranging, $$\Delta s_m = \frac{F\left\{\sum_{c=1}^{C} F^{-1}\{s_m L_c\}\right\}}{L_m} - s_m \tag{6d}$$

For any function F that realistically models the non-linear level behavior of human perception, such errors are generally small because the growth of loudness is close to linear over a large range. However, to minimize such errors, it may be desirable to add an optional correction to the basic implementation of the invention. Without loss of generality, one may represent such a correction as scaling deltas $\Delta s_c$ introduced to the loudness scaling of each individual channel so that that the overall loudness scaling error $\Delta s_m$ in Eqn. 6d is reduced. Generally, the scaling deltas $\Delta s_c$ are different from channel to channel. Incorporation of these channel scaling deltas $\Delta s_c$ into Eqn. 6d yields the modified expression:

$$\Delta s_m = \frac{F\left\{\sum_{c=1}^{C} F^{-1}\{(s_m + \Delta s_c)L_c\}\right\}}{L_m} - s_m \tag{6e}$$

The individual channel gains with the application of such a correction are then given by:

$$g_c^{\Delta} = \frac{F^{-1}\{(s_m + \Delta s_c)L_c\}}{P_c} \text{ for each of } C \text{ channels} \tag{6f}$$

One may employ any suitable technique to arrive at channel scaling deltas $\Delta s_c$, within some tolerable range, so that the absolute value of the overall loudness scaling error $\Delta s_m$ in Eqn. 6e is made smaller than that in Eqn. 6d. Thus, the absolute value of $\Delta s_m$ is made smaller. In the two implementation examples given below, it is, ideally, reduced to zero. However, the degree of the reduction in the absolute value of $\Delta s_m$ may be traded off against the size of each channel scaling delta $\Delta s_c$ so as to minimize audible channel loudness variation artifacts, in which case the ideal value of $\Delta s_m$ is not zero. The two examples of correction implementations are next described below.

An example of one way to implement such a correction is to compute first the individual channel gains $g_c$ according to a basic implementation of the invention as in Eqn. 5b and to compute next a single correction gain G for all channels that is multiplied by each channel gain $g_c$ to yield corrected channel gains, $g_c^{\Delta} = Gg_c$. The gain G is computed so that the overall loudness after the application of the gains $g_c^{\Delta}$ to each channel is equal to the original overall loudness scaled by the desired amount:

$$s_m L_m = F\left\{\sum_{c=1}^{C} g_c^{\Delta} P_c\right\} = F\left\{G\sum_{c=1}^{C} g_c P_c\right\} \tag{7a}$$

Solving for G yields:

$$G = \frac{F^{-1}\{s_m L_m\}}{\sum_{c=1}^{C} g_c P_c} \tag{7b}$$

This correction reduces the absolute value of the overall loudness scaling error $\Delta s_m$. Ideally, as is evident from inspection of Eqn. 7a (there is no $\Delta s_m$ factor—the scaling error is set to zero), it is reduced to zero. In practical arrangements, the scaling error may not be zero as a result of calculation accuracy, signal processing time lags, etc. Also, as mentioned above, the size of each channel scaling delta $\Delta s_c$ may be taken into account in limiting the degree of reduction of the $\Delta s_m$ error factor.

The corresponding channel scaling deltas $\Delta s_c$ are not specified directly but rather implicitly through the calculation of G. Given G, one may rearrange Eqn. 6f to solve for each channel's scaling delta $\Delta s_c$ as the ratio of the loudness of the particular channel after the application of the corrected channel gain $g_c^\Delta$ to the loudness of the original channel minus the desired overall loudness scaling:

$$\Delta s_c = \frac{F\{Gg_c P_c\}}{L_m} - s_m \quad (7c)$$

Note that it is not necessary to solve for $\Delta s_c$ (the desired correction to the overall (multichannel) loudness is effected by adjusting each channel's gain by applying the common G factor). Eqn. 7c is shown for the purpose of exposition in explaining the first correction example.

Because in practice the overall loudness scaling achieved by way of the individual channel gains is close to the desired overall loudness scaling $s_m$, the resulting correction gain G typically is close to unity and the corresponding channel scaling deltas are close to zero. As a result, the correction is not likely to cause any objectionable spatial changes.

An example of another way to apply a correction is to find a channel scaling delta $\Delta s$ common to all channels, such that $\Delta s_c = \Delta s$ for all channels, which results in reducing the absolute value of the overall loudness scaling error $\Delta s_m$. Ideally, as is evident from inspection of Eqn. 8 (there is no $\Delta s_m$ factor—the scaling error is set to zero), it is reduced to zero. In practical arrangements, the scaling error may not be zero as a result of calculation accuracy, signal processing time lags, etc. Plugging these constraints into Eqn. 6e yields the condition:

$$s_m L_m = F\left\{\sum_{c=1}^{C} F^{-1}\{(s_m + \Delta s)L_c\}\right\} \quad (8)$$

One may solve Eqn. 8 for $\Delta s$ and then compute the corresponding corrected channel gains $g_c^\Delta$ using Eqn. 6f in which $\Delta s_c = \Delta s$ for all channels. In practice, solving Eqn. 8 for $\Delta s$ requires an iterative numerical technique and is therefore less desirable than the first correction implementation described.

Aspects of the two above-described correction examples may be summarized in the following table:

Summary of Correction Examples

| Version | Gain (per channel) | Loudness Scaling (per channel) |
|---|---|---|
| Version 1 | Total gain of $Gg_c$ applied to each channel. G is the same for each channel, but $g_c$ is different for each channel. Solve for each channel's $g_c$ using Eqn. 5b and for common G using Eqn. 7b | Different scaling $s_m + \Delta s_c$ for each channel The loudness scaling delta $\Delta s_c$ is implicitly determined when solving for G |
| Version 2 | A different gain $g_c^\Delta$ is applied to each channel. Solve for each channel's $g_c^\Delta$ using Eqn. 8 and Eqn. 6f in which $\Delta s_c = \Delta s$ for all channels | Same scaling $s_m + \Delta s$ for each channel Solve for the loudness scaling delta $\Delta s$ using Eqn. 8 |

Other techniques may exist for applying approximately the same loudness scaling to each individual channel of a multichannel signal while at the same time applying approximately a desired change to the overall loudness, and this invention is meant to cover all such techniques.

BEST MODE FOR CARRYING OUT THE INVENTION

Figure 3:
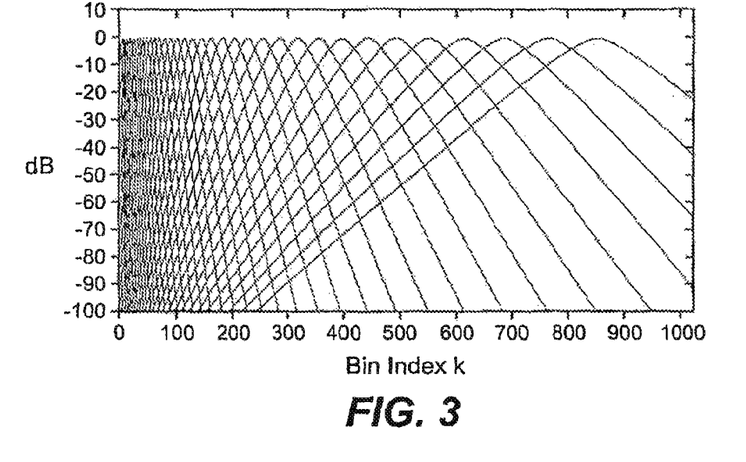
FIG. 3 shows a set of critical band filter responses useful for computing an excitation signal for a psychoacoustic loudness model.

In said WO 2004/111994 A2 application and said PCT/US2005/038579 application, Seefeldt et al and Seefeldt disclose, among other things, an objective measure of perceived loudness based on a psychoacoustic model. From a monophonic audio signal, x[n], the method first computes an excitation signal E[b,t] approximating the distribution of energy along the basilar membrane of the inner ear at critical band b during time block t. This excitation may be computed from the Short-time Discrete Fourier Transform (STDFT) of the audio signal as follows:

$$E[b,t] = \lambda_b E[b, t-1] + (1-\lambda_b)\sum_k |T[k]|^2 |C_b[k]|^2 |X[k,t]|^2 \quad (9)$$

where X[k,t] represents the STDFT of x[n] at time block t and bin k. T[k] represents the frequency response of a filter simulating the transmission of audio through the outer and middle ear, and $C_b[k]$ represents the frequency response of the basilar membrane at a location corresponding to critical band b. FIG. 3 depicts a suitable set of critical band filter responses in which forty bands are spaced uniformly along the Equivalent Rectangular Bandwidth (ERB) scale, as defined by Moore and Glasberg (B. C. J. Moore, B. Glasberg, T. Baer, "A Model for the Prediction of Thresholds, Loudness, and Partial Loudness," *Journal of the Audio Engineering Society*, Vol. 45, No. 4, April 1997, pp. 224-240). Each filter shape is described by a rounded exponential function and the bands are distributed using a spacing of 1 ERB. Lastly, the smoothing time constant $\lambda_b$ in (9) may be advantageously chosen proportionate to the integration time of human loudness perception within band b.

Using equal loudness contours, such as those depicted in FIG. 2, the excitation at each band is transformed into an excitation level that would generate the same loudness at 1 kHz. Specific loudness, a measure of perceptual loudness distributed across frequency and time, is then computed from the transformed excitation, $E_{1kHz}[b,t]$, through a compressive non-linearity. One such suitable function to compute the specific loudness N[b,t] is given by:

$$N[b,t] = \beta\left(\left(\frac{E_{1kHz}[b,t]}{TQ_{1kHz}}\right)^\alpha - 1\right) \quad (10)$$

where $TQ_{1kHz}$ is the threshold in quiet at 1 kHz and the constants $\beta$ and $\alpha$ are chosen to match growth of loudness data as shown in FIG. 1. Finally, the total loudness, L[t], represented in units of sone, is computed by summing the specific loudness across bands:

$$L[t] = \sum_b N[b,t] \quad (11)$$

For the purposes of adjusting the audio signal, one may wish to compute a wideband gain g[t], which when multiplied by the audio signal makes the loudness of the adjusted audio equal to some desired target loudness, $\hat{L}[t]$, as measured by the described psychoacoustic technique. The target loudness $\hat{L}[t]$ may be computed in a variety of ways. For example, in the case of a volume control it may be computed as a fixed scaling of the original loudness L[t]. Alternatively, more sophisticated functions of the loudness L[t] may be used, such as an Automatic Gain Control (AGC) or Dynamic Range Control (DRC). Regardless of how $\hat{L}[t]$ is computed, the corresponding gain g[t] is computed in the same way. Letting the function $F_L$ represent the transformation from excitation to loudness such that $$L[t]=F_L\{E[b,t]\} \quad (12a)$$

the gain g[t] is computed such that $$\hat{L}[t]=F_L\{g[t]E[b,t]\} \quad (12b)$$

Rearranging (12a-b), one arrives at the solution $$g[t] = \frac{F_L^{-1}\{s[t]L[t]\}}{E[b,t]} \text{ for any } b \quad (12c)$$

where s[t] is the loudness scaling associated with $\hat{L}[t]$ such that $$s[t] = \frac{\hat{L}[t]}{L[t]} \quad (12d)$$

and the inverse function $F_L^{-1}$ is constrained to generate an excitation that is a wideband scaling of the original excitation E[b,t]. Due to the nature of the function $F_L$ (a non-linearity applied to each band followed by a summation across bands), a closed form solution for the inverse function $F_L^{-1}$ does not exist. Instead, an iterative technique described in said WO 2004/111994 A2 application may be used to solve for the gain g[t].

Rather than compute a wideband gain g[t] to modify the audio, one may instead compute a multiband gain g[b,t] which when applied to the original audio results in a modified audio signal whose specific loudness is substantially equal to some desired target specific loudness $\hat{N}[b,t]$. By computing a multiband gain instead of a wideband gain, control of the perceived spectral balance, or timbre, of the audio may be achieved. For example, with a volume control, the target specific loudness may be computed as a band-independent scaling of the original specific loudness N[b,t], thereby preserving the original timbre of the audio as the volume is changed. In said PCT/US2005/038579 application, a variety of other techniques for computing $\hat{N}[b,t]$ as a function of N[b,t] are described, including AGC, multiband DRC, and Dynamic EQ (DEQ). Letting the function $F_N$ represent the transformation from excitation to specific loudness such that $$N[b,t]=F_N\{E[b,t]\} \quad (13a)$$

the gain g[b,t] is computed such that $$\hat{N}[b,t]=F_N\{g[b,t]E[b,t]\} \quad (13b)$$

Rearranging (13a-b), one arrives at the solution $$g[b,t] = \frac{F_N^{-1}\{s[b,t]N[b,t]\}}{E[b,t]} \quad (13c)$$

where s[b,t] is the specific loudness scaling associated with $\hat{N}[b,t]$ such that $$s[b,t] = \frac{\hat{N}[b,t]}{N[b,t]} \quad (13d)$$

In said PCT/US2005/038579 application, several techniques for computing $F_N^{-1}$ in (12c) are described, including a closed form expression, a lookup table, and iterative search.

Consider now a multichannel audio signal $x_c[n]$, c=1...C, from which an excitation $E_c[b,t]$ may be computed for each channel c. A total excitation $E_m[b,t]$ for the multichannel signal may be computed by summing all the channel excitations:

$$E_m[b,t] = \sum_{c=1}^{C} E_c[b,t] \quad (14a)$$

and a corresponding total loudness and specific loudness may be computed from the total excitation according to:

$$L_m[t]=F_L\{E_m[b,t]\} \quad (14b)$$

$$N_m[b,t]=F_N\{E_m[b,t]\} \quad (14c)$$

Likewise the loudness and specific loudness of each individual channel may be computed from each channel excitation:

$$L_c[t]=F_L\{E_c[b,t]\} \quad (15a)$$

$$N_c[b,t]=F_N\{E_c[b,t]\} \quad (15b)$$

Now suppose that one wishes to modify the multichannel audio signal so that either the total loudness $L_m[t]$ is scaled by $s_m[t]$ or the total specific loudness $N_m[b,t]$ is scaled by $s_m[b,t]$. In the first case, one may solve for a wideband gain $g_m[t]$ such that $$s_m[t]L_m[t]=F_L\{g_m[t]E_m[b,t]\} \quad (16a)$$

and in the second case solve for a multiband gain $g_m[b,t]$ such that $$s_m[b,t]N_m[b,t]=F_N\{g_m[b,t]E_m[b,t]\} \quad (16b)$$

In both cases the same gain is then applied to all channels c, but as discussed earlier, this may result is a distortion of the perceived spatial balance of the multichannel signal. In order to preserve the spatial balance, one may instead compute gains $g_c[t]$ or $g_c[b,t]$ for each channel such that each individual channel loudness or specific loudness is scaled by the desired amount:

$$s_m[t]L_c[t]=F_L\{g_c[t]E_c[b,t]\} \quad (17a)$$

$$s_m[b,t]N_c[b,t]=F_N\{g_c[b,t]E_c[b,t]\} \quad (17b)$$

This way, the relative loudness or specific loudness between all channels is preserved. However, when these gains $g_c[t]$ or $g_c[b,t]$ are applied to the corresponding channels of the original multichannel audio, the total loudness of the resulting modified multichannel audio signal may not exactly equal the total loudness of the original multichannel audio signal scaled by the desired amount. More specifically, $$s_m[t]L_m[t] \neq F_L\left\{\sum_{c=1}^{C} g_c[t]E_c[b,t]\right\} \quad (18a)$$

and $$s_m[b,t]N_m[b,t] \neq F_N\left\{\sum_{c=1}^{C} g_c[b,t]E_c[b,t]\right\} \quad (18b)$$

In many cases, the two sides of Eqns. 18a and 18b will be nearly equal and therefore for some applications the resulting error may be ignored. For the best results, however, one may compute a correction gain G[t] or G[b,t] applied to all channels such that $$s_m[t]L_m[t] = F_L\left\{G[t]\sum_{c=1}^{C} g_c[t]E_c[b, t]\right\} \tag{19a}$$

and $$s_m[b, t]N_m[b, t] = F_N\left\{G[b, t]\sum_{c=1}^{C} g_c[b, t]E_c[b, t]\right\} \tag{19b}$$

This way the desired total loudness scaling may be achieved. In most cases, the correction gain G[t] or G[b,t] is small, and therefore the spatial balance of the multichannel signal is largely preserved.

Figure 4A:
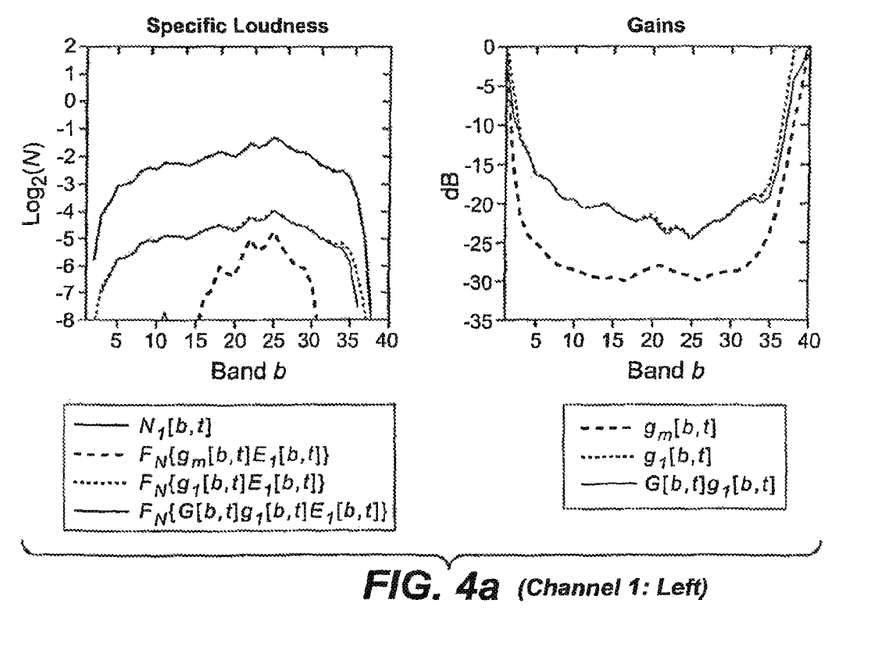
FIGS. 4a-f depict the specific loudness spectra and gains resulting from the modification of the specific loudness of a multichannel audio signal.
Figure 4B:
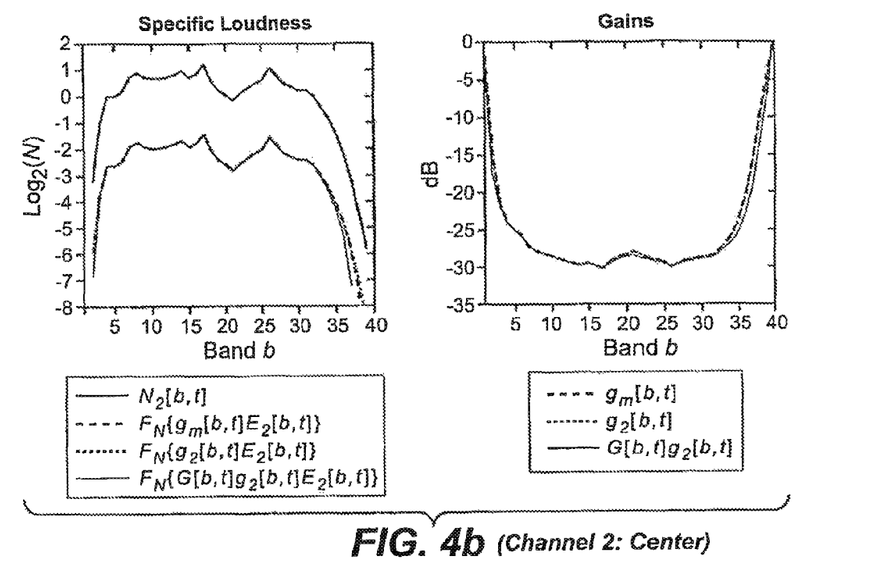
Figure 4C:
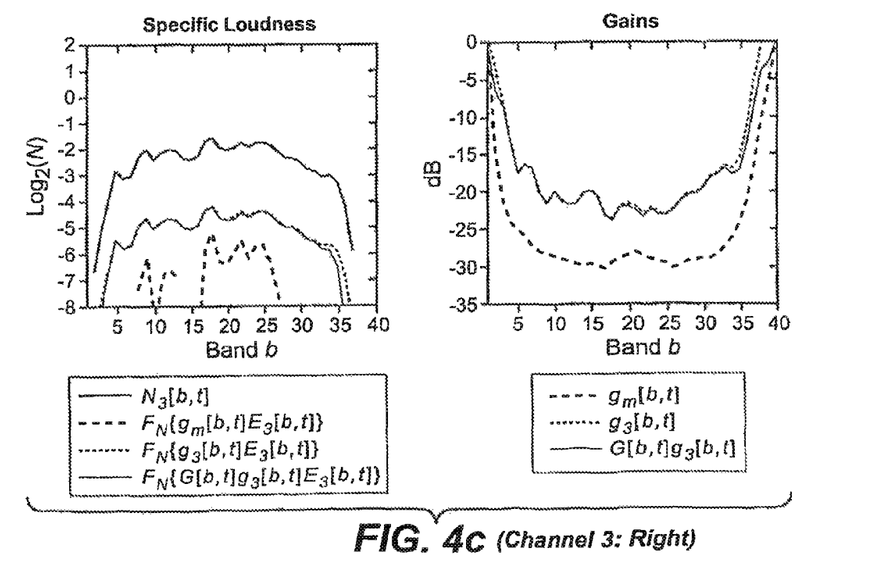
Figure 4D:
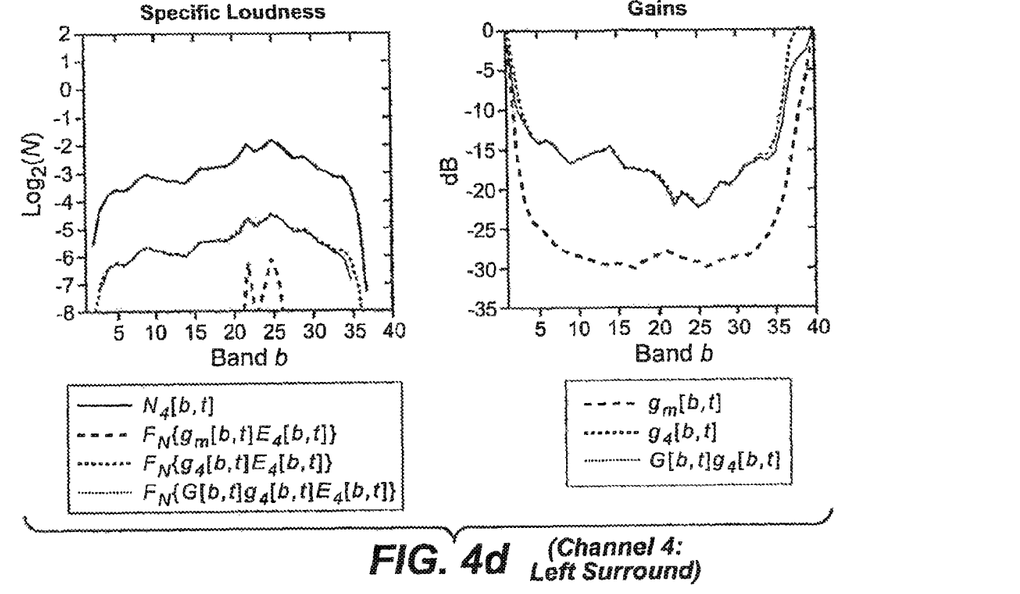
Figure 4E:
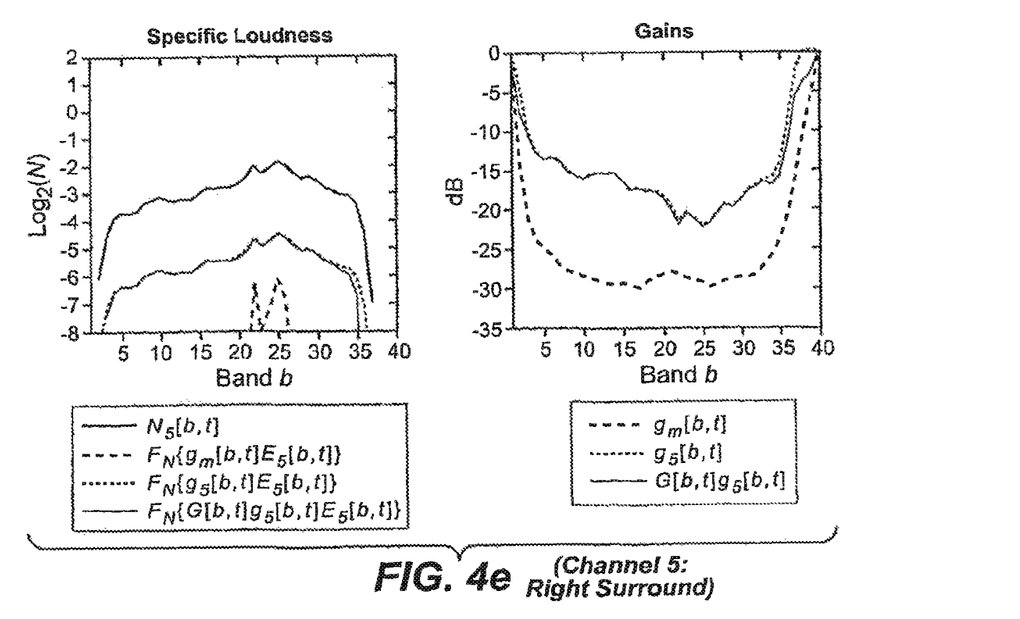
Figure 4F:
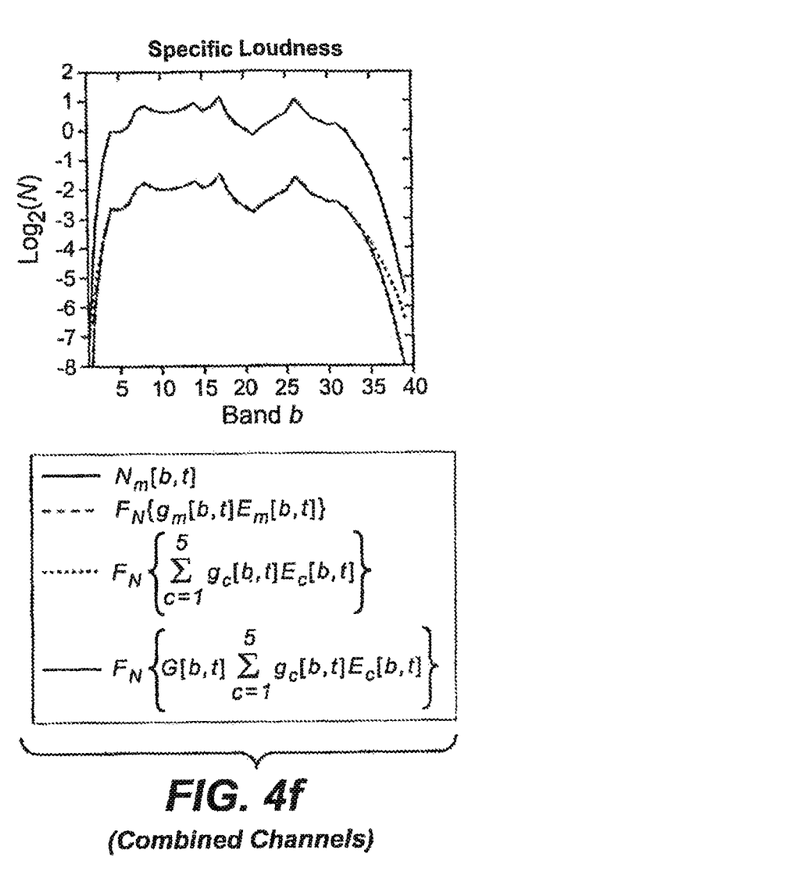

In FIGS. 4a-4f are depicted plots of the specific loudness and multiband gains for the modification of a multichannel audio signal consisting of five channels: left, center, right, left-surround, and right-surround. This particular audio signal is dominated by dialogue in the center channel, with the remaining four channels containing ambience signals of a much lower level used to convey to the impression of being in a large hall. For this particular case, the multiband gains $g_m[b,t]$ and $g_c[b,t]$ (c=1 . . . 5) are computed in order to achieve a specific loudness scaling of $s_m[b,t]$=0.16 for all bands b. Examining the center channel (c=2) in FIG. 4b, one notes that the two specific loudness spectra resulting from the application of the same gain for all channels $g_m[b,t]$ and the channel-specific gain $g_2[b,t]$ are nearly identical. This is because the center channel contains the vast majority of the signal energy, and therefore computation of $g_m[b,t]$ from the combined excitation $E_m[b,t]$ is influenced mainly by this channel. Examining the remaining channels, however, one notes a large discrepancy between the two specific loudness spectra resulting from the application of $g_m[b,t]$ and $g_c[b,t]$. In these cases, because the signals are so small in comparison to the center channel, application of $g_m[b,t]$ results in a modified specific loudness that is far smaller than the desired scaling of 0.16. For many bands, the modified specific loudness falls below the threshold of hearing. This is most evident in the left and right surround channels (c=4 and 5). Application of $g_c[b,t]$, on the other hand, results in the desired specific loudness scaling. In FIG. 4f is depicted the specific loudness of all channels combined after the application of $g_m[b,t]$ to all channels and of $g_c[b,t]$ to each respective channel. One notes that, in the first case, the modified specific loudness is equal to the original combined specific loudness scaled by the desired amount, as expected. Application of $g_c[b,t]$ to each respective channel results in a modified specific loudness that is close to this result, but a small error exists at the lower and higher bands. This error is eliminated through the further application of the correction gain G[b,t], which is close to zero dB for most bands b. The average absolute value of G[b,t] across bands is 0.6 dB, and the maximum absolute value of G[b,t] is only 3.7 dB. Returning to FIGS. 4a-4e, one notes that the application of the correction gain has only a minor effect on the modified specific loudness of each individual channel.

Implementation

The invention may be implemented in hardware or software, or a combination of both (e.g., programmable logic arrays). Unless otherwise specified, algorithms and processes included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein. A number of embodiments of the invention have been described. Nevertheless, it will be understood that various modifications may be made without departing from the spirit and scope of the invention. For example, some of the steps described herein may be order independent, and thus can be performed in an order different from that described.

What is claimed is:

1. A method for scaling perceived loudness of an audio signal, comprising:

changing a first gain to scale a first perceived loudness of a first channel by a scale factor to a first new perceived loudness of the first channel, each of the first perceived loudness and the first new perceived loudness being a respective value of a nonlinear function of a power of the first channel;

changing a second gain to scale a second perceived loudness of a second channel by the scale factor to a second new perceived loudness of the second channel, each of the second perceived loudness and the second new perceived loudness being a respective value of a nonlinear function of a power of the second channel;

wherein the first and second gains differ and are specifically selected so that a first ratio between the first new perceived loudness and the first perceived loudness equals a second ratio between the second new perceived loudness and the second perceived loudness;

where the method is performed by one or more computing devices.

2. The method of claim 1, wherein the first channel is a front channel and the second channel is a surround channel.

3. An apparatus for scaling perceived loudness of an audio signal, comprising:

a subsystem, implemented at least partially in hardware that changes a first gain to scale a first perceived loudness of a first channel by a scale factor to a first new perceived loudness of the first channel, each of the first perceived loudness and the first new perceived loudness being a respective value of a nonlinear function of a power of the first channel;

a subsystem, implemented at least partially in hardware that changes a second gain to scale a second perceived loudness of a second channel by the scale factor to a second new perceived loudness of the second channel, each of the second perceived loudness and the second new perceived loudness of the second channel being a respective value of a nonlinear function of a power of the second channel;

wherein the first and second gains differ and are specifically selected so that a first ratio between the first new perceived loudness and the first perceived loudness equals a second ratio between the second new perceived loudness and the second perceived loudness.

4. The apparatus of claim 3, wherein the first channel is a front channel and the second channel is a surround channel.

5. A non-transitory computer readable medium, storing software instructions for scaling perceived loudness of an audio signal, which when executed by one or more processors cause performance of the steps of:

changing a first gain to scale a first perceived loudness of a first channel by a scale factor to a first new perceived loudness of the first channel, each of the first perceived loudness and the first new perceived loudness being a respective value of a nonlinear function of a power of the first channel;

changing a second gain to scale a second perceived loudness of a second channel by the scale factor to a second new perceived loudness of the second channel, each of the second perceived loudness and the second new perceived loudness of the second channel being a respective value of a nonlinear function of a power of the second channel;

wherein the first and second gains differ and are specifically selected so that a first ratio between the first new perceived loudness and the first perceived loudness equals a second ratio between the second new perceived loudness and the second perceived loudness.

6. The non-transitory computer readable medium of claim 5, wherein the first channel is a front channel and the second channel is a surround channel.

7. A method for scaling perceived loudness of an audio signal comprising:

changing a first gain of a first frequency band of a first channel and a second gain of a second frequency band of the first channel to scale a first perceived loudness of the first channel by a scale factor to a first new perceived loudness of the first channel, each of the first perceived loudness and the first new perceived loudness being a respective value of a nonlinear function of a weighted power of the first channel;

changing a third gain of a third frequency band of a second channel and a fourth gain of a fourth frequency band of the second channel to scale a second perceived loudness of the second channel by the scale factor to a second new perceived loudness of the second channel, each of the second perceived loudness and the second new perceived loudness being a respective value of a nonlinear function of a weighted power of the second channel;

wherein the first, second, third, and fourth gains differ and are specifically selected so that a first ratio between the first new perceived loudness and the first perceived loudness equals a second ratio between the second new perceived loudness and the second perceived loudness;

wherein the method is performed by one or more computing devices.

8. The method of claim 7, wherein the first channel is a front channel and the second channel is a surround channel.

9. The method of claim 7, wherein the perceived loudness of the first channel and the perceived loudness of the second channel are each measured in a single wideband frequency band.

10. An apparatus for scaling perceived loudness of an audio signal comprising:

a subsystem, implemented at least partially in hardware that changes a first gain of a first frequency band of a first channel and a second gain of a second frequency band of the first channel to scale a first perceived loudness of the first channel by a scale factor to a second new perceived loudness of the second channel, each of the second perceived loudness and the second new perceived loudness being a respective value of a nonlinear function of a weighted power of the second channel;

a subsystem, implemented at least partially in hardware that changes a third gain of a third frequency band of a second channel and a fourth gain of a fourth frequency band of the second channel to scale a second perceived loudness of the second channel by the scale factor to a second new perceived loudness of the second channel, each of the second perceived loudness and the second new perceived loudness being a respective value of a nonlinear function of a weighted power of the second channel;

wherein the first, second, third, and fourth gains differ and are specifically selected so that a first ratio between the first new perceived loudness and the first perceived loudness equals a second ratio between the second new perceived loudness and the second perceived loudness.

11. The apparatus of claim 10, wherein the first channel is a front channel and the second channel is a surround channel.

12. The apparatus of claim 10, wherein the perceived loudness of the first channel and the perceived loudness of the second channel are each measured in a single wideband frequency band.

13. A non-transitory computer readable medium, storing software instructions for scaling perceived loudness of an audio signal, which when executed by one or more processors cause performance of the steps of:

changing a first gain of a first frequency band of a first channel and a second gain of a second frequency band of the first channel to scale a first perceived loudness of the first channel by a scale factor to a first new perceived loudness of the first channel, each of the first perceived loudness and the first new perceived loudness being a respective value of a nonlinear function of a weighted power of the first channel;

changing a third gain of a third frequency band of a second channel and a fourth gain of a fourth frequency band of the second channel to scale a second perceived loudness of the second channel by the scale factor to a second new perceived loudness of the second channel, each of the second perceived loudness and the second new perceived loudness being a respective value of a nonlinear function of a weighted power of the second channel;

wherein the first, second, third, and fourth gains differ and are specifically selected so that a first ratio between the first new perceived loudness and the first perceived loudness equals a second ratio between the second new perceived loudness and the second perceived loudness.

14. The non-transitory computer readable medium of claim 13, wherein the first channel is a front channel and the second channel is a surround channel.

15. The non-transitory computer readable medium of claim 13, wherein the perceived loudness of the first channel and the perceived loudness of the second channel are each measured in a single wideband frequency band.

* * * * *